US008062954B2

(12) United States Patent
Poelzl

(10) Patent No.: US 8,062,954 B2
(45) Date of Patent: Nov. 22, 2011

(54) METHOD FOR MANUFACTURING A FIELD PLATE IN A TRENCH OF A POWER TRANSISTOR

(75) Inventor: Martin Poelzl, Ossiach (AT)

(73) Assignee: Infineon Technologies AG, Neubiberg (DE)

( * ) Notice: Subject to any disclaimer, the term of this patent is extended or adjusted under 35 U.S.C. 154(b) by 189 days.

(21) Appl. No.: 12/427,098

(22) Filed: Apr. 21, 2009

(65) Prior Publication Data

US 2009/0291543 A1 Nov. 26, 2009

(30) Foreign Application Priority Data

May 23, 2008 (DE) .................... 10 2008 024 949

(51) Int. Cl.
*H01L 21/76* (2006.01)
(52) U.S. Cl. ........ 438/432; 438/270; 438/454; 438/589; 257/E21.41; 257/E21.547

(58) Field of Classification Search .............. 438/431, 438/432, 454, 589, 270; 257/E21.41, E21.547
See application file for complete search history.

(56) References Cited

U.S. PATENT DOCUMENTS

| 4,255,207 A * | 3/1981 | Nicolay et al. ............... 438/427 |
| 4,635,090 A * | 1/1987 | Tamaki et al. ............... 257/513 |
| 5,082,795 A * | 1/1992 | Temple ........................ 438/138 |
| 5,283,201 A | 2/1994 | Tsang et al. |
| 5,973,360 A | 10/1999 | Tihanyi |
| 6,406,975 B1 * | 6/2002 | Lim et al. ..................... 438/421 |
| 7,005,351 B2 | 2/2006 | Henninger et al. |
| 7,303,961 B2 * | 12/2007 | Weber et al. .................. 438/272 |

FOREIGN PATENT DOCUMENTS

DE 102 34 996 B4 1/2008

* cited by examiner

*Primary Examiner* — Mary Wilczewski
*Assistant Examiner* — Toniae Thomas
(74) *Attorney, Agent, or Firm* — Slater & Matsil, L.L.P.

(57) ABSTRACT

A method for manufacturing a field plate in a trench of a power transistor in a substrate of a first conductivity type is disclosed. The trench is formed in a first main surface of the substrate.

16 Claims, 4 Drawing Sheets

Interrelationship between the field oxide thickness and the polyoxide thickness

—○— FOX thickness after POLOX oxidation

METHOD FOR MANUFACTURING A FIELD PLATE IN A TRENCH OF A POWER TRANSISTOR

This application claims priority to German Patent Application 10 2008 024 949.1, which was filed May 23, 2008 and is incorporated herein by reference.

TECHNICAL FIELD

The present invention relates to a method for manufacturing a field plate in a trench of a power transistor.

BACKGROUND

Power transistors having a low ON-resistance $R_{ON}$ and a low gate-source and gate-drain capacity $C_{GS}$ and $C_{GD}$ (in total low input capacitance) are required for use in DC/DC converters. According to U.S. Pat. No. 5,973,360 issued to Tihany (the '360 patent) the lower ON-resistance of an SFET3 is achieved by the field plate principle. In particular, the '360 patent discloses a field effect-controllable semiconductor component that includes a semiconductor substrate. A drain zone of a first conductivity type is disposed in the semiconductor substrate and a gate electrode composed of polycrystalline silicon is also disposed in the semiconductor substrate. A source region of a second conductivity type is introduced in the drain zone. The drain zone includes a trench structure that reaches from the surface of the semiconductor substrate into the drain zone. A field plate is in the trench structure and an oxide layer surrounds the field plate. The oxide layer has a thickness that increases in a direction towards the drain zone.

In order to lower the gate-drain capacitance of power MOSFETs, the gate electrode G may be replaced by a field electrode F set at a source potential or another defined potential (see, for example, U.S. Pat. No. 5,283,201 to Tsang), and a gate electrode G' having a very small overlap region with the drain region. In this arrangement the small $C_{GD}$ dispersion is adjusted by etching of the field electrode. The field plate is wet-chemically defined via the field electrode. This results in a considerable surface ratio of source-gate electrode overlap, which on the one hand defines the $C_{GS}$ and on the other hand, in thin field electrode oxides, also defines the minimal thickness of the gate oxide in the transition region from the thin oxide (MOS channel region) to the thick oxide (field electrode region).

Up to now, the higher $C_{GS}$ has been tolerated for the benefit of the low $C_{GD}$ that can be achieved by this concept. With regard to a gate oxide thinning, a minimal planar oxide thickness has to be defined in order to comply with the service life requirements of the oxide. Consequently, the performance of the transistor with regard to the ON-resistance (in particular $R_{ON}$ at a gate voltage $V_G$ of 4.5 V) is limited.

SUMMARY

Embodiments of the invention provide a method for manufacturing a field plate in a trench of a power transistor in a substrate of a first conductivity type with a drain region. The trench is formed in a first main surface of the substrate. In the method, a field oxide layer is grown on the first main surface of the substrate. Polysilicon is deposited at least in the trench and etched in the trench up to a predetermined first level above the bottom of the trench. The polysilicon in the trench and the field oxide layer on the side wall of the trench are thermally oxidized such that the growth rate of the polysilicon oxide is higher than the growth rate of the oxide on the side walls of the trench. The polysilicon oxide in the trench and the oxide on the side walls of the trench are etched such that the polysilicon oxide is removed by etching up to the top side of the polysilicon. The polysilicon remains up to a second level from the bottom of the trench, and the oxide on the side walls of the trench is etched up to the second level at the most. A gate oxide layer is formed in the trench and on the first main surface of the substrate such that the polysilicon remaining in the trench below the gate oxide layer forms a field plate.

The additional polysilicon oxidation step of the present manufacturing method has the advantage that it is possible to etch the polysilicon in the trench with a low tolerance up to a predetermined level and to safely avoid a "pincer formation" (i.e., an embracing effect).

Further advantages and features of the present invention result from the description of embodiments together with the figures.

BRIEF DESCRIPTION OF THE DRAWINGS

FIG. 2, show steps of a method according to an embodiment of the invention.

DETAILED DESCRIPTION OF ILLUSTRATIVE EMBODIMENTS

Figure 1:
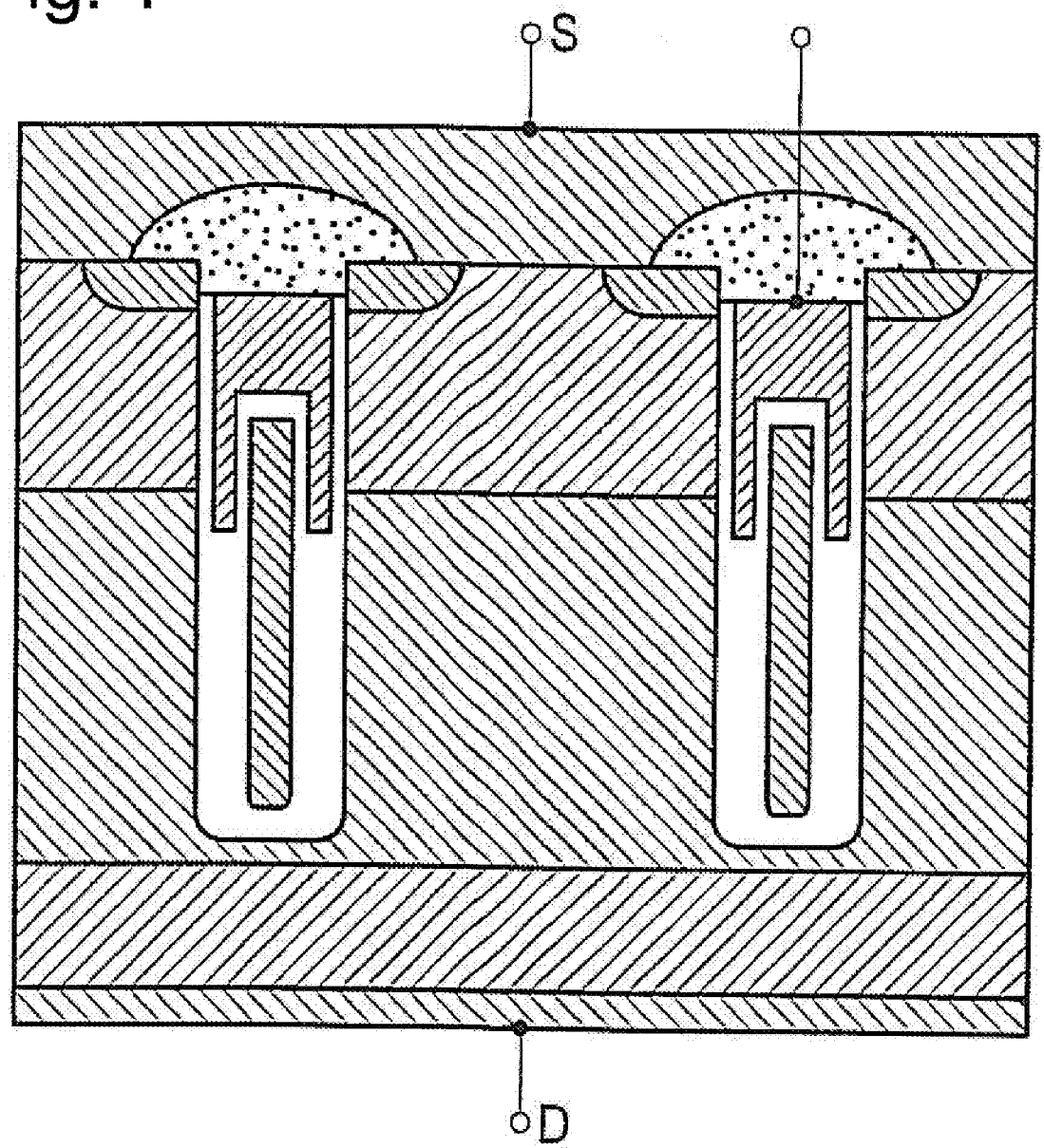
FIG. 1 shows the presence of a polysilicon "pincer" in a power transistor, which has been manufactured according to a conventional method.

During the oxidation of polysilicon in the method according to embodiments of the present invention, the oxide at the side wall of the trench (having a thickness of, for example, 100 nm according to FIG. 3) is further oxidized, wherein approximately 150 nm oxidize at the polysilicon. In addition, the effect of faster growth of the polysilicon oxide can be used, which, provided that suitable oxidation conditions are selected, is 1.5 times faster than on Si (see FIG. 3). In case of a field oxide having an initial thickness of, for example, 100 nm, a total of 135 nm is achieved on the field oxide due to the additional oxidation of about 140 nm on polysilicon. Subsequently, etching of the field oxide (defining the active region) is carried out by a wet-chemical etching step (by means of a lithographic mask technique) (see FIG. 2f). Thereby, the field electrode is slightly exposed, without being considerably underetched, wherein control of the underetching is possible in the range of a tolerance of 20 nm, preferably 15 nm and in particular 10 nm. Thereby, the formation of a polysilicon "pincer" (see FIG. 1 showing a power transistor with a polysilicon "pincer") and thus also a stress below such a polysilicon pincer are avoided. By avoiding the formation of a pincer, the gate oxide grows more homogeneous at the transition to the thick oxide, since it does not depend on the geometry of the pincer (i.e., on the thickness of the polysilicon oxide).

A silicon substrate comprising a trench and a drain region, which can be processed with the method according to embodiments of the present invention, can be manufactured as follows.

Figure 2A:
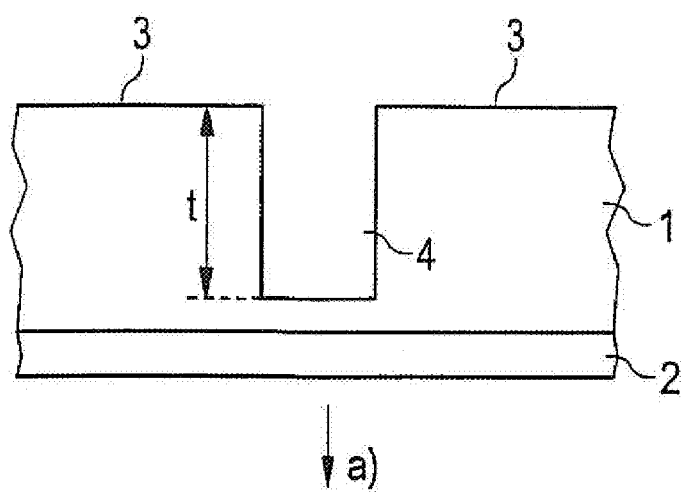
FIGS. 2a-g, collectively

Referring to FIG. 2a, a drain region 2 is formed in an Si substrate 1 of a first conductivity type (n or p). The drain region 2 is formed on a surface opposed to a first main surface 3. A trench 4 is formed from the first main surface 3 up to a predetermined depth t. The method steps for manufacturing this Si substrate 1 are known and correspond, for example, to the method known from U.S. Pat. No. 5,283,201.

Figure 2B:
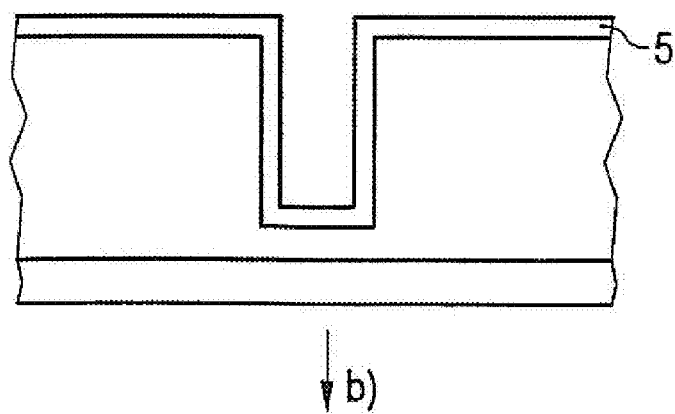

Referring to FIG. 2b, a field oxide layer 5 is grown on the first main surface 3 of the substrate 1. This step can be carried out by means of a thermal oxidation in a known manner, for example, by dry or wet thermal oxidation.

Figure 2C:
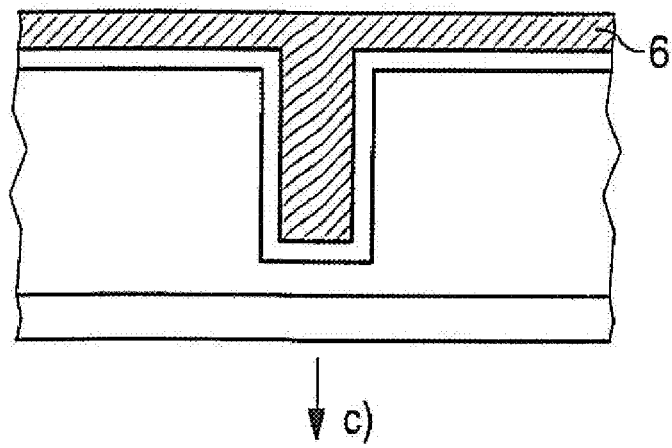

Referring to FIG. 2c, polysilicon 6 is deposited at least in the trench 4 and, optionally, on the first main surface 3 of the substrate 1. This step can, for example, be carried out by means of chemical vapor deposition (CVD), e.g., low pressure CVD (LPCVD).

Figure 2D:
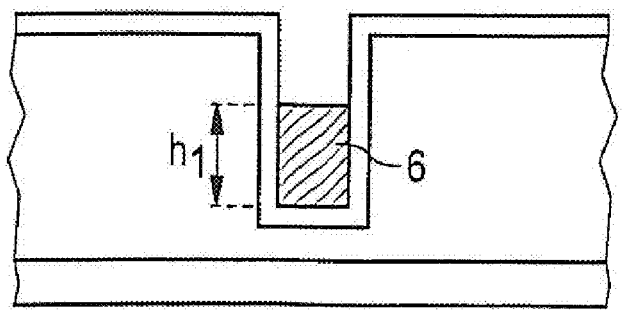

Referring to FIG. 2d, the polysilicon 6 is etched by means of selective wet-etching or isotropic plasma-etching. In this case, the polysilicon 6 is etched in the trench 4 up to a predetermined first level $h_1$ above the bottom of the trench 4. The selective wet-etching can, for example, be carried out by means of dip etching or spray etching with a $HF/HNO_3$ mixture.

Figure 2E:
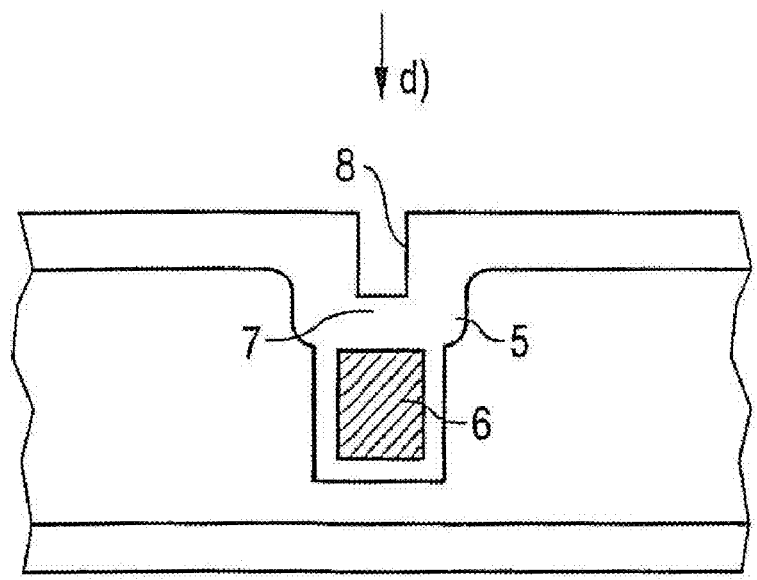

Referring to FIG. 2e, the polysilicon 6 in the trench 4 and the field oxide layer 5 on the side walls of the trench 4 can be thermally oxidized. The growth rate of the polysilicon oxide 7 is higher than the growth rate of the oxide 5, 8 on the side walls of the trench 4. The thermal oxidation can be carried out dry or wet or in a combination thereof.

Figure 2F:
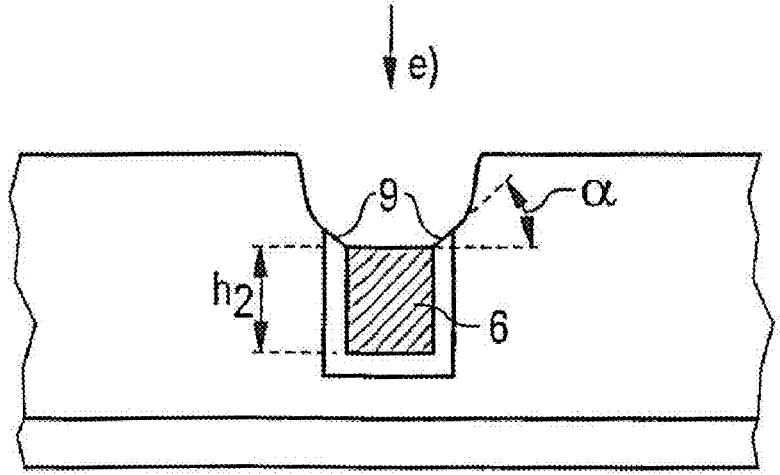
Figure 3:
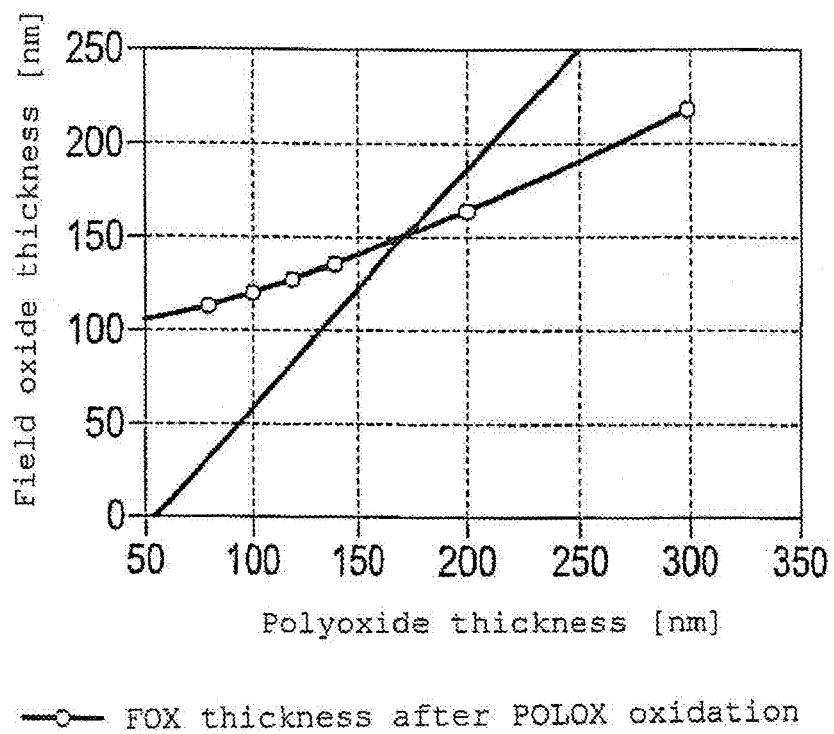
FIG. 3 shows the interrelationship between the field oxide thickness and the polysilicon oxide thickness during the thermal oxidation of polysilicon.

Referring to FIG. 2f, the resulting polysilicon oxide 7 and the oxide 5, 8 on the side walls of the trench 4 is etched by means of selective wet-etching. The polysilicon oxide 7 is removed by etching up to the top side of the polysilicon 6 with a tolerance of 20 nm, preferably 15 nm and in particular 10 nm, such that the polysilicon 6 remains up to a second level $h_2$ from the bottom of the trench 4. The oxide 5, 8 on the side walls of the trench 4 is etched up to the second level $h_2$ at the most. Selective wet-etching of the oxides is carried out, for example, by dip etching or spray etching with hydrofluoric acid.

Figure 2G:
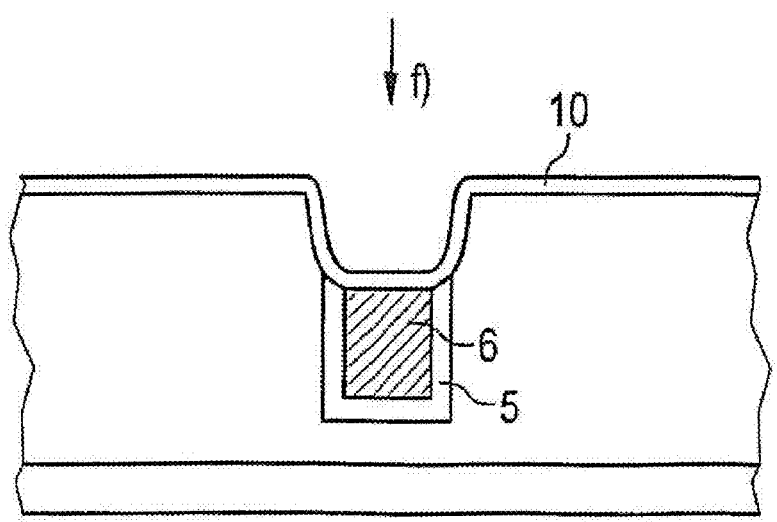

Referring to FIG. 2g, a gate oxide layer 10 is formed in the trench 4 and on the first main surface 3 of the substrate 1. The gate oxide layer 10 can be formed, for example, by dry or wet thermal oxidation.

In one embodiment of the method, etching of the oxide 5, 8 on the side walls of the trench 4 is carried out such that the remaining oxide 9 is in planar alignment with the surface of the polysilicon 6 or forms an angle $\alpha$ with the surface of the polysilicon 6 in the trench 4. This is shown in FIG. 2f. The angle $\alpha$ can be 0 to 40°, preferably 0 to 25°.

In a further embodiment of the method, in the oxidation shown in FIG. 2e, the growth rate of the polysilicon oxide 7 may be adjusted up to 1.5 times higher than the growth rate of the oxide 8 at the side wall of the trench.

With the method of the present invention, a field plate in a trench of a power transistor having a lowered gate-source capacity and an optimized gate oxide thickness in the region of the field electrode transition is obtained by introducing an additional thermal oxidation step, which, compared to the solution provided conventionally, provides for an essential performance advantage in particular with respect to thin field oxides.

What is claimed is:

1. A method for manufacturing a field plate in a trench in a substrate, wherein the trench is formed in a first main surface of the substrate, the method comprising:
   growing a field oxide layer over the first main surface of the substrate and side walls of the trench;
   depositing polysilicon at least in the trench;
   etching the polysilicon, wherein the polysilicon is etched in the trench up to a first level above a bottom of the trench;
   thermally oxidizing the polysilicon in the trench and the field oxide layer on side walls of the trench, wherein the polysilicon oxide has a growth rate that is higher than a growth rate of the oxide on the side wall of the trench;
   etching the polysilicon oxide in the trench and the oxide on the side walls of the trench, wherein the polysilicon oxide is removed by etching up to a top side of the polysilicon, such that the polysilicon remains up to a second level from the bottom of the trench, and the oxide on the side walls of the trench is etched to a third level from the bottom of the trench, the third level being as far or farther from the bottom of the trench than the second level; and
   forming a gate oxide layer in the trench and on the first main surface of the substrate, wherein the polysilicon remaining in the trench below the gate oxide layer forms a field plate.

2. The method according to claim 1, wherein etching the polysilicon oxide in the trench and the oxide on the side walls of the trench is carried out such that remaining oxide is in planar alignment with a surface of the polysilicon.

3. The method according to claim 1, wherein etching the polysilicon oxide in the trench and the oxide on the side walls of the trench is carried out such that remaining oxide forms an angle with a surface of the polysilicon in the trench.

4. The method according to claim 3, wherein the angle is 0° to 40°.

5. The method according to claim 3, wherein the angle is 0° to 25°.

6. The method according to claim 1, wherein the growth rate of the polysilicon oxide is higher than the growth rate of the oxide on the side walls of the trench by a factor of up to 1.5.

7. The method according to claim 1, further comprising forming a drain at a surface of the substrate opposed to the first main surface.

8. A method for manufacturing a field plate in a trench of a power transistor in a substrate of a first conductivity type with a drain region, wherein the trench is formed in a first main surface of the substrate, the method comprising:
   growing a field oxide layer on the first main surface of the substrate and side walls of the trench;
   depositing polysilicon at least in the trench;
   etching the polysilicon, wherein the polysilicon is etched in the trench up to a first level above a bottom of the trench;
   thermally oxidizing the polysilicon in the trench and the field oxide layer on side walls of the trench, such that the polysilicon oxide has a growth rate that is higher than a growth rate of the oxide on the side walls of the trench;
   etching the polysilicon oxide in the trench and the oxide on the side walls of the trench, wherein the polysilicon oxide is removed by etching up to a top side of the polysilicon, such that the polysilicon remains up to a second level from the bottom of the trench, and wherein the oxide on the side walls of the trench is etched to a third level from the bottom of the trench, the third level being as far or farther from the bottom of the trench than the second level, wherein the etching of the oxide on the side walls of the trench is carried out such that remaining oxide is in planar alignment with a surface of the polysilicon or forms an angle with a surface of the polysilicon in the trench; and
   forming a gate oxide layer in the trench and on the first main surface of the substrate, such that the polysilicon remaining in the trench below the gate oxide layer forms a field plate.

9. The method according to claim 8, wherein the angle is 0° to 40°.

10. The method according to claim 8, wherein the angle is 0° to 25°.

11. The method according to claim 8, wherein the growth rate of the polysilicon oxide is higher than the growth rate of the oxide on the side walls of the trench by a factor of up to 1.5.

12. A method for manufacturing a field plate in a trench of a power transistor in a substrate of a first conductivity type with a drain region, wherein the trench is formed in a first main surface of the substrate, the method comprising:
   growing a field oxide layer on the first main surface of the substrate and side walls of the trench;
   depositing polysilicon at least in the trench;
   etching the polysilicon, wherein the polysilicon is etched in the trench up to a predetermined first level above a bottom of the trench;
   thermally oxidizing the polysilicon in the trench and the field oxide layer on side walls of the trench, wherein a growth rate of the polysilicon oxide is higher than a growth rate of the oxide on the side walls of the trench by a factor of up to 1.5;
   etching the polysilicon oxide in the trench and the oxide on the side walls of the trench, wherein the polysilicon oxide is removed by etching up to a top side of the polysilicon, such that the polysilicon remains up to a second level from the bottom of the trench, and the oxide on the side walls of the trench is etched to a third level from the bottom of the trench, the third level being as far or farther from the bottom of the trench than the second level; and
   forming a gate oxide layer in the trench and on the first main surface of the substrate, wherein the polysilicon remaining in the trench below the gate oxide layer forms a field plate.

13. The method according to claim 12, wherein etching the polysilicon oxide in the trench and the oxide on the side walls of the trench is carried out such that remaining oxide is in planar alignment with a surface of the polysilicon.

14. The method according to claim 12, wherein etching the polysilicon oxide in the trench and the oxide on the side walls of the trench is carried out such that remaining oxide forms an angle with a surface of the polysilicon in the trench.

15. The method according to claim 14, wherein the angle is 0° to 40°.

16. The method according to claim 14, wherein the angle is 0° to 25°.

* * * * *